(12) United States Patent  (10) Patent No.: US 9,123,767 B2
Inoue  (45) Date of Patent: Sep. 1, 2015

(54) MOS SEMICONDUCTOR DEVICE

(71) Applicant: FUJI ELECTRIC CO., LTD., Kawasaki-shi (JP)

(72) Inventor: Masanori Inoue, Ina (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/219,709

(22) Filed: Mar. 19, 2014

(65) Prior Publication Data

US 2014/0284656 A1   Sep. 25, 2014

(30) Foreign Application Priority Data

Mar. 21, 2013   (JP) ................................. 2013-058527

(51) Int. Cl.
*H01L 29/66*   (2006.01)
*H01L 29/739*   (2006.01)
*H01L 29/78*   (2006.01)
*H01L 29/10*   (2006.01)
*H01L 29/06*   (2006.01)

(52) U.S. Cl.
CPC ............ *H01L 29/7393* (2013.01); *H01L 29/78* (2013.01); *H01L 29/0696* (2013.01); *H01L 29/1095* (2013.01); *H01L 29/7395* (2013.01); *H01L 29/7397* (2013.01)

(58) Field of Classification Search
CPC . H01L 29/7393; H01L 29/78; H01L 29/7395; H01L 29/0696; H01L 29/1095; H01L 29/7397
USPC ......... 257/139, 330, 333, 335, 329, 140, 328, 257/629, 341; 438/138
See application file for complete search history.

(56) References Cited

U.S. PATENT DOCUMENTS

| 5,877,527 | A | * | 3/1999 | Okabe et al. ................... 257/328 |
| 5,998,833 | A | * | 12/1999 | Baliga ........................... 257/329 |
| 6,054,752 | A | * | 4/2000 | Hara et al. ..................... 257/629 |
| 6,303,410 | B1 | * | 10/2001 | Baliga ........................... 438/138 |
| 8,319,278 | B1 | * | 11/2012 | Zeng et al. ..................... 257/330 |
| 8,378,420 | B2 | * | 2/2013 | Mallikarjunaswamy ..... 257/341 |
| 2009/0085103 | A1 | * | 4/2009 | Hille et al. ..................... 257/330 |
| 2011/0147835 | A1 | * | 6/2011 | Radic et al. ................... 257/333 |
| 2012/0168861 | A1 | * | 7/2012 | Seok ............................. 257/335 |

(Continued)

FOREIGN PATENT DOCUMENTS

| JP | H08-236766 A | 9/1996 |
| JP | 2001-024184 A | 1/2001 |
| JP | 2003-008014 A | 1/2003 |

(Continued)

*Primary Examiner* — Mohammed Shamsuzzaman
(74) *Attorney, Agent, or Firm* — Rabin & Berdo, P.C.

(57) ABSTRACT

An MOS semiconductor device including an MOS gate structure is disclosed. The MOS semiconductor device includes a p-type well region selectively disposed on the surface layer of an n-type drift layer formed on a semiconductor substrate forming an n-type drain region; an n-type source region selectively disposed on the surface layer of the p-type well region; and a gate electrode placed, via an insulating film, on the surface of a channel formation region on the surface layer of the p-type well region sandwiched between the n-type source region and the surface layer of the n-type drain region, wherein a surface in the channel formation region has a level difference formed in the direction of the peripheral length, and all over the length, of the channel formation region.

3 Claims, 15 Drawing Sheets

(56) References Cited

U.S. PATENT DOCUMENTS

2013/0307060 A1* 11/2013 Wang et al. .................. 257/330
2014/0138737 A1* 5/2014 Bobde et al. .................. 257/140

FOREIGN PATENT DOCUMENTS

| | | |
|---|---|---|
| JP | 2004-511084 A | 4/2004 |
| JP | 2010-272741 A | 12/2010 |

* cited by examiner

MOS SEMICONDUCTOR DEVICE

CROSS REFERENCE TO RELATED APPLICATION

The entire disclosure of the inventor's corresponding Japanese patent application, Serial No. JP PA 2013-058527, filed Mar. 21, 2013, is hereby incorporated by reference.

BACKGROUND OF THE INVENTION

1. Field of the Invention

The present invention relates to an MOS semiconductor device such as an MOSFET (an insulated gate field effect transistor).

2. Description of the Background Art

For the purpose of lowering on-resistance (Ron), an MOSFET is such that a surface cell pattern (101 and 102) including an MOS structure is being more and more miniaturized, such as from FIG. 13A to FIG. 13B, in accordance with the energy saving trend in the world. FIG. 2 shows an enlarged sectional view of a ½ pitch size of the cell pattern 101 shown by the dotted frame of FIG. 13A, and FIG. 3 shows an enlarged sectional view of a ½ pitch size of the cell pattern 102 shown by the dotted frame of FIG. 13B. A cell pitch b is smaller than a cell pitch a. Consequently, a channel length $L_2$ of the MOS structure of the cell pitch b is shorter than a channel length $L_1$ of the MOS structure of the cell pitch a, meaning that it is possible to make the on-resistance of the MOSFET of FIG. 13B lower than that of the MOSFET of FIG. 13A.

On-resistance (Ron), which is of important characteristics of an MOSFET, is roughly separated into three resistance components; Rch (channel resistance), Rjfet (resistance based on a junction FET), and Repi (the resistance of an n-type drift layer 2 formed by an epitaxial growth), as shown by a main portion sectional view of an MOSFET in FIG. 12. That is, one is the Rch which is the resistance component of each n channel 5 of the MOS structure. Another is the Rjfet which is the resistance of a surface layer of the n-type drift layer 2 sandwiched between adjacent p-type body regions 3. Still another is the Repi which is the resistance of the n-type drift layer 2 depending on a breakdown voltage. Also, the Rjfet and Repi are determined in conjunction with a quasi-plane-junction shape too. A description will be given of a heretofore known method as a method of lowering each on-resistance (Ron) component.

A method of reducing a channel length L by miniaturizing the cell pattern, as previously described, an increase of a series of circuits by a reduction in cell pitch, and the like, are well-known general methods of lowering the Rch (channel resistance).

A method, such as an optimization of the impurity concentration in a width $B_L$ of a junction FET region (between the p-type body regions 3) or an increase of a series of circuits by a reduction in cell pitch, is carried out in order to lower the Rjfet (resistance based on the junction FET). The miniaturization of the cell pattern relates to any of the methods.

There is the following method of lowering the Repi (resistance of the n-type drift layer 2). The p-type body regions 3 are densely disposed to make a nearly planar quasi-plane junction. The junction surface of the p-type body regions 3 is sufficiently approximated to the original plane junction by this quasi-plane junction, and thus formed into a nearly planar waved shape. By so doing, it is possible to increase a breakdown voltage determined by the shape of a pn junction surface to a value close to that of a theoretical breakdown voltage resulting from the plane junction. Heretofore, a high breakdown voltage has been maintained by making the specific resistance of the n-type drift layer 2 higher than a specific resistance value at which the theoretical breakdown voltage can be obtained, and thus sacrificing the on-resistance. However, it is possible to lower the specific resistance at the same breakdown voltage by making the pn junction of the p-type body regions 3 to be the quasi-plane junction, as a result of which it is possible to lower the resistance component (Repi) of the n-type drift layer 2.

The cell pattern miniaturization is usually carried out for lowering any of the three resistance components. The previously described miniaturization of the cell pattern of the heretofore known MOSFET from FIG. 13A to FIG. 13B also conforms with this flow.

It is known that there exist the following kinds of documents relating to this kind of miniaturization of the cell pattern of the MOSFET, a decrease in the on-resistance (Ron), and an improvement of an SOA. With regard to an insulated gate bipolar transistor (IGBT) device, there is described a method of improving an SOA by increasing a channel length (L) (increasing the Rch) (JP-A-2001-24184). Also, with regard to a device relating to an IGBT in the same way, there is described a non-linear channel shape wherein a planar portion of an n channel and an n channel in the vertical portion of a sidewall of a gate trench are combined together (JP-A-2010-272741). Furthermore, as a solution to the problem that a trade-off between the previously described on-resistance (Ron) and SOA becomes obvious, it is described that a channel conductance Gd is lowered by changing gate threshold voltages (Vth) of the respective opposed channels in the p-type body regions 3 (JP-T-2004-511084(the term "JP-T" as used herein means a published Japanese translation of a PCT patent application)). Also, there is a document in which is described a technology of miniaturizing the cell pattern of a planar MOSFET (JP-A-2003-008014). There is also a document in which is described a technology relating to a shallow trench (JP-A-8-236766).

However, the MOSFET whose cell structure is miniaturized for the purpose of lowering the on-resistance (Ron) is such that there may arise the problem that the safe operating area (hereafter, the SOA) of the MOSFET decreases on the high voltage side, as shown by the ○ marks in FIGS. 4 and 5. FIGS. 4 and 5 are Vds-Id characteristic diagrams showing SOAs of MOSFETs with a rated voltage of 250V and a rated current of 13 A in FIG. 4 and of 42 A in FIG. 5. FIG. 4 corresponds to the MOSFET of FIG. 13A, and FIG. 5 corresponds to the MOSFET of FIG. 13B.

For example, it is found when comparing 20V and 250V in FIG. 4 that the SOA decreases in power from 1000 W to 750 W, while it is found from a comparison of 10V and 250V in FIG. 5 that the SOA decreases in power from 1000 W to 125 W.

A more detailed description will be given of the previously described problem. It is conceivable that the reason for the SOA decreasing in this way is that local heat generation is occurring in a device chip, as in FIG. 6 (an MOSFET rated at 250V and 13 A) and FIG. 7 (an MOSFET rated at 250V and 42 A), each showing a generated heat distribution in the saturation region of a heretofore known MOSFET, the miniaturization of the cell structure (cell pattern) of which has been carried out. FIGS. 6 and 7 are top views of resin seal type (package type: TO220) MOSFETs corresponding to FIGS. 4 and 5, respectively, each showing a condition in which heat is generated in the saturation region when energizing. In each of FIGS. 6 and 7, a design of a heat-generated condition of an MOSFET chip is made, excluding a seal resin, as well as region portions high in generated heat temperature being shaded in such away as to look darker as the temperature increases. Temperature ranges corresponding to the respective shadings are described in FIGS. 6 and 7. It can bee seen in a comparison of FIGS. 6 and 7 that the high heat generation regions in FIG. 6 are wider than those in FIG. 7. The names of elements of the semiconductor device (the MOSFET chip, a gate terminal, a drain terminal, a source terminal, source and gate connecting wires, a metal frame, and the like) are described for reference in each of the top views of FIGS. 6 and 7.

The reason that this kind of local heat generation occurs in the MOSFET chip will be described referring to diagrams of FIGS. 8 and 9, each representing a relationship between a channel conductance Gd (the gradient of a drain-source current Id) to agate voltage Vg of an MOSFET and temperature characteristics. FIG. 8 corresponds to the MOSFET of FIG. 6, and FIG. 9 corresponds to the MOSFET of FIG. 7.

Each forward transfer characteristic diagram (FIGS. 8 and 9) is obtained by combining the dependence of the gate threshold voltage Vth and carrier mobility on temperature (junction temperature) and the dependence of the drain-source current (Id) (hereafter abbreviated simply to the current (Id)) of each MOSFET device on the gate voltage (Vg). That is, each of these characteristic diagrams is such that the amounts of current (Id) flowing through the channel of the MOSFET at a predetermined gate voltage Vg are plotted with respect to the gate voltage (Vg) with different temperatures (junction temperatures) as parameters. In general, the channel conductance (Gd) (the gradient of this curved line) decreases with the temperature. Each of FIGS. 8 and 9 shows that a plurality of plot lines formed by the different temperatures cross through one point. The point at which the plurality of Id-Vg curved lines cross is called a cross point.

In the region of the current (Id) and Vg below the cross point, Id further increases with a rise in temperature with respect to a constant Vg (a positive temperature coefficient). For example, a certain portion of the MOSFET, that is, one unit cell or a plurality of adjacent cells are considered. Herein, the cell is the unit of MOSFET including one gate, and for example, FIG. 1 shows a half of the cell. In the region of Id or Vg below the cross point, when the current concentrates on a specific portion for some reason, the temperature (junction temperature) in the portion rises. Then, the current in the portion increases because the Id-Vg characteristics have the positive temperature coefficient when the gate voltage is constant. As a result of this, more current is caused to concentrate on the specific portion, meaning that positive feedback acts on Id, and a current operation of the MOSFET becomes unstable with a rise in temperature.

Meanwhile, in the region of Id or Vg below the cross point, Id decreases with a rise in temperature with respect to a constant Vg (a negative temperature coefficient). Because of this, even though the current concentrates on a certain portion, and the temperature rises in the certain portion, the current in the portion decreases, meaning that negative feedback acts on Id. As a result of this, the current operation of the MOSFET remains stable despite a rise in temperature.

A description will be given of the unstability of an operation in the region of Id and Vg below the cross point. In the case of the operation below the cross point, the gate threshold voltage (Vth) drops when the temperature of a local region of the device chip rises due to some problem with a wafer process or to packaging heterogeneity. When the gate threshold voltage (Vth) drops, a gate drive becomes stronger, thus raising the current (Id). More heat is generated in the local region due to the rising current (Id), and the gate threshold voltage (Vth) further drops. The positive feedback occurs in this way, thus resulting in a failure or breakdown due to hot spotting and eventually to thermal runaway or the like of the device.

FIG. 9 shows a forward transfer characteristic diagram of the heretofore known MOSFET device (FIG. 13B) whose cell pattern is still more miniaturized than in FIG. 8. As shown in FIG. 8 (the MOSFET rated at 250V and 13 A) and FIG. 9 (the MOSFET rated at 250V and 42 A), it can be seen that the "positive" temperature coefficient region (the region below the cross point) of FIG. 9 is wider than that of FIG. 8 as the cell pattern of the device chip is more miniaturized.

The gate threshold voltage (Vth) naturally varies even in one device, and the drain-source current (Id) (hereafter, the current (Id)) starts to flow from a portion in which the gate threshold voltage (Vth) is lowest. By the current (Id) flowing locally in this way, heat is generated in this local area, but when the temperature coefficient of the channel conductance is positive at this time, it is easier for the current to flow, and the current concentrates, due to which the SOA decreases. Conversely, when the temperature coefficient is negative, it is difficult for the current (Id) to flow as a result of a rise in temperature, and the current (Id) is uniformized in the device. It is conceivable that, as a result of this, a wide SOA appropriate for the size of the device is secured in order to cause the current (Id) to flow uniformly in the whole of the device.

However, with only a simple cell pattern miniaturization such as the previously described miniaturization from FIG. 13A to FIG. 13B, when the on-resistance (Ron) decreases, the SOA also decreases (deteriorates) at the same time. Therefore, there arises a new problem in that the trade-off between the on-resistance (Ron) and SOA becomes obvious, as previously described.

SUMMARY OF THE INVENTION

The invention, having been contrived bearing in mind the heretofore described points, has an object of providing an MOS semiconductor device wherein it is possible to expand a safe operating area of a high voltage region while maintaining low on-resistance characteristics.

In order to achieve the object, the invention is an MOS semiconductor device including an MOS gate structure formed of: a second conductivity type well region selectively disposed on the surface layer of a first conductivity type semiconductor substrate forming a drain region; a first conductivity type source region selectively disposed on the surface layer of the second conductivity type well region; and a gate electrode covering, via an insulating film, the surface of a channel formation region on the surface layer of the second conductivity type well region sandwiched between the first conductivity type source region and the surface layer of the first conductivity type drain region, wherein a surface in the channel formation region has a level difference formed in the direction of the peripheral length, and all over the length, of the channel formation region. It is preferable that a surface on the lower side of the level difference has the first conductivity type source region. It is also preferable that a surface on the upper side of the level difference has the first conductivity type source region. It is preferred that the MOS semiconductor device is an MOSFET. Also, it is also good that the MOS semiconductor device is an IGBT.

According to the invention, it is possible to provide an MOS semiconductor device wherein it is possible to expand a safe operating area of a high voltage region while maintaining low on-resistance characteristics.

DETAILED DESCRIPTION OF THE INVENTION

Figure 1:
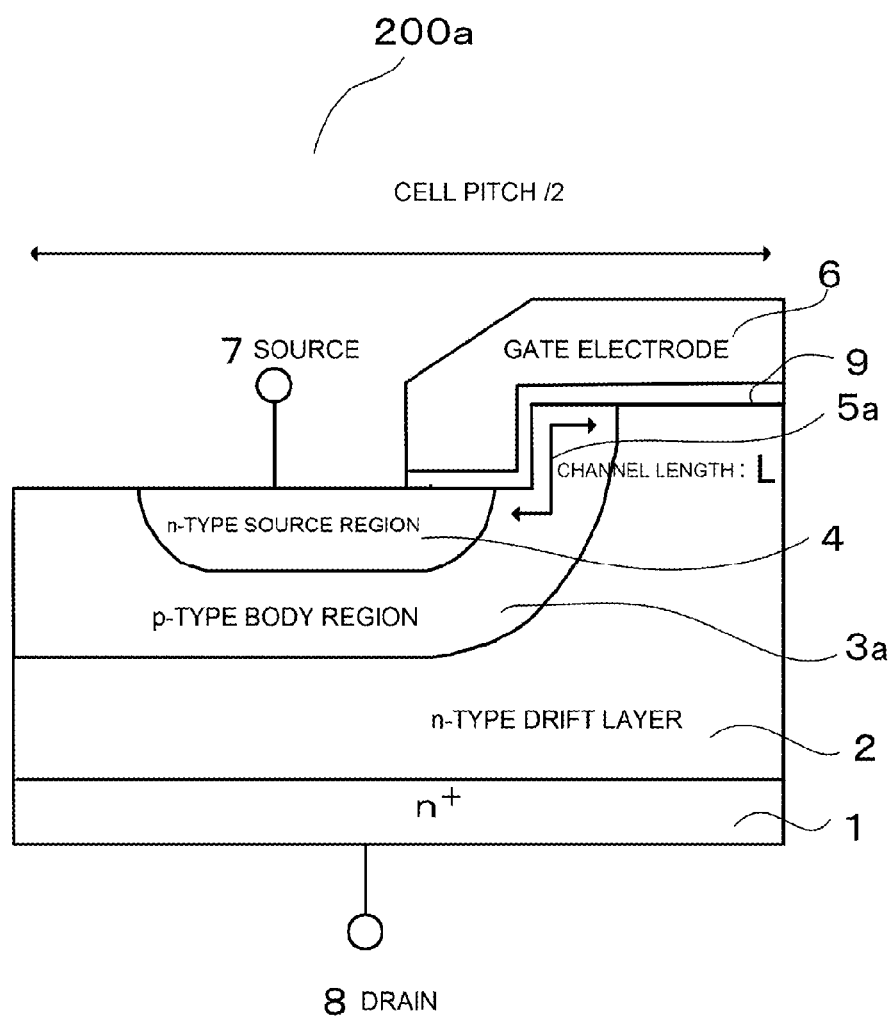
FIG. 1 is a main portion sectional view of a planar MOSFET according to the invention.
Figure 2:
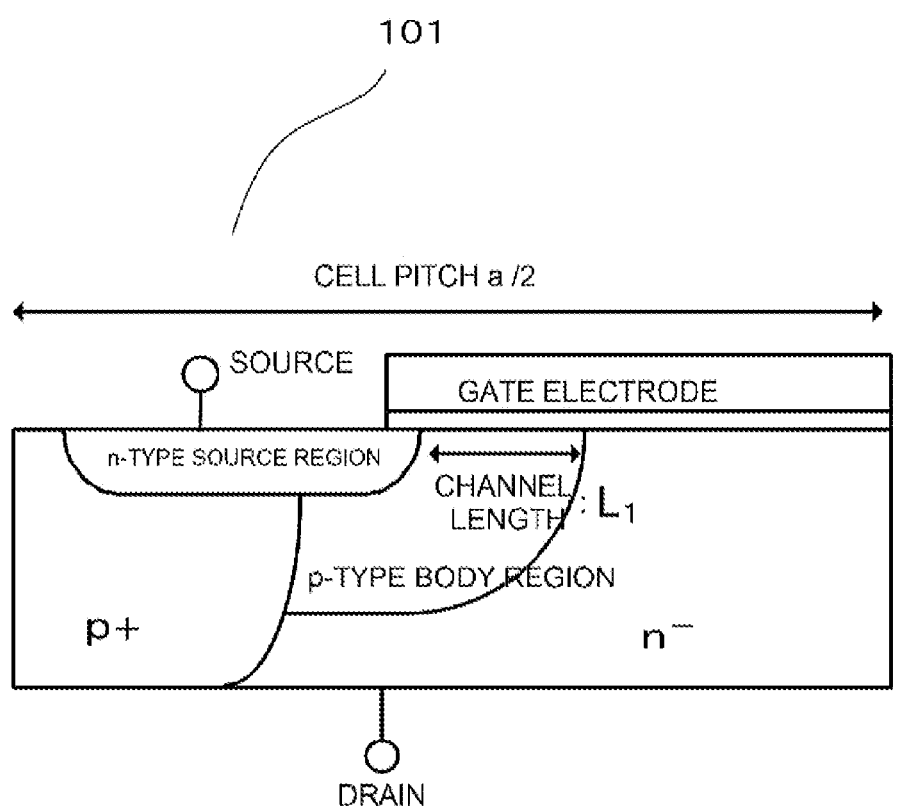
FIG. 2 is a main portion sectional view of a heretofore known MOSFET.
Figure 3:
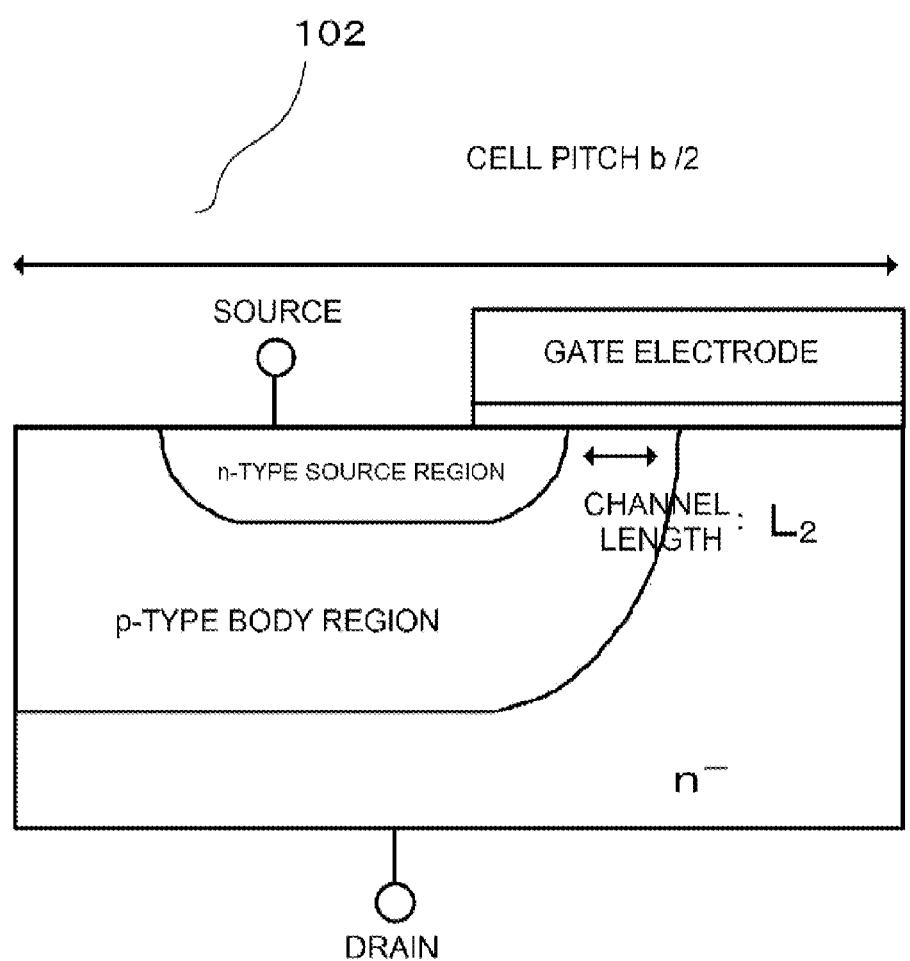
FIG. 3 is a main portion sectional view of a heretofore known MOSFET.
Figure 4:
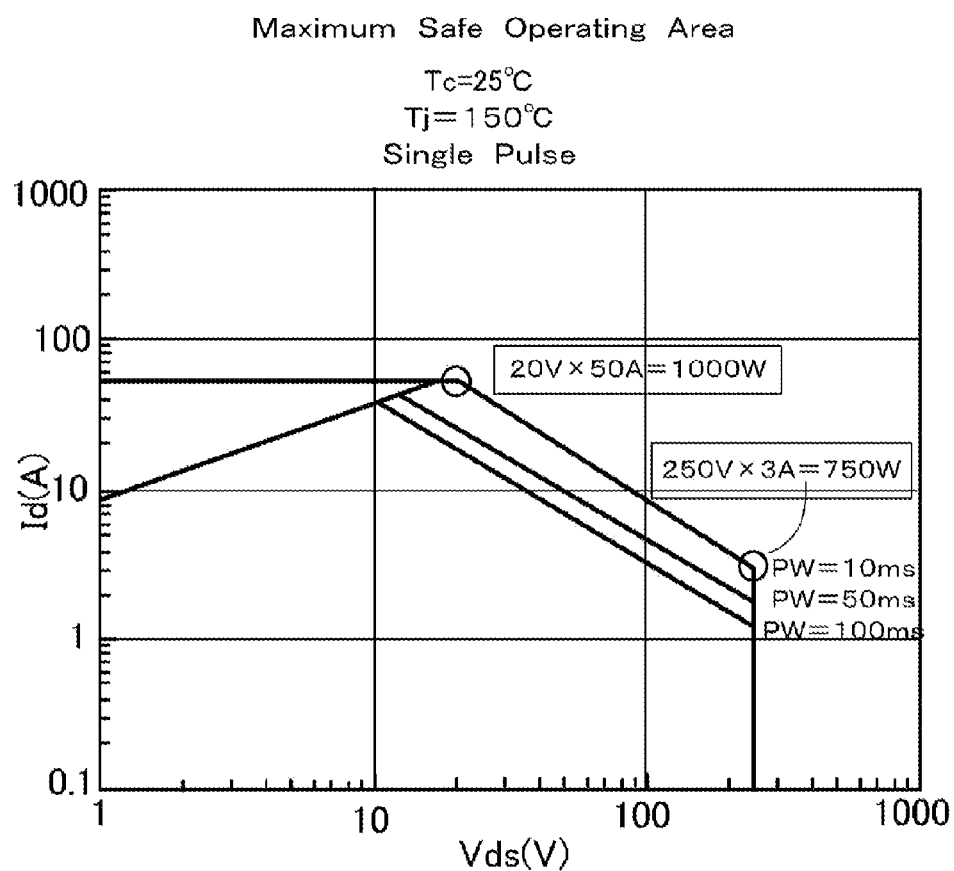
FIG. 4 is a diagram showing a safe operating area (SOA) of the heretofore known MOSFET.
Figure 5:
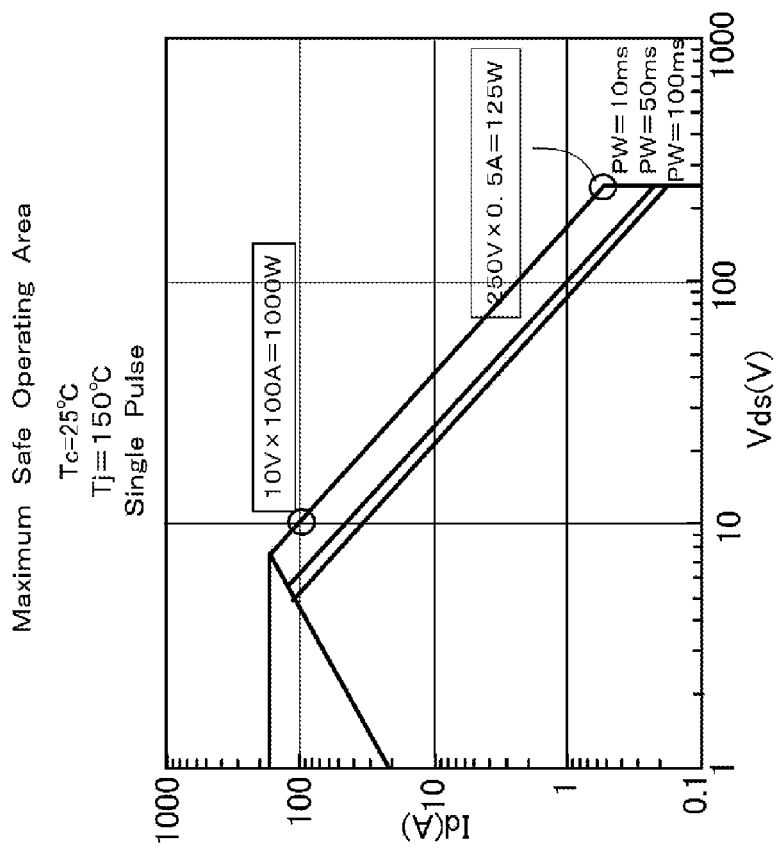
FIG. 5 is a diagram showing a safe operating area (SOA) of the heretofore known MOSFET.
Figure 6:
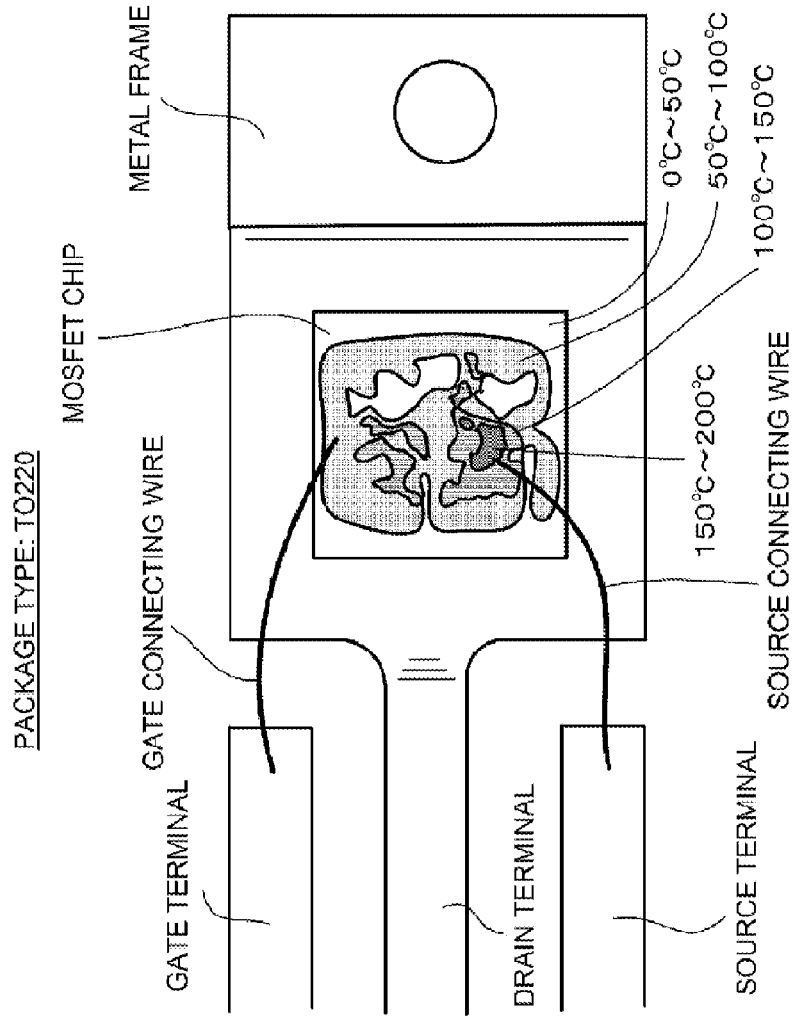
FIG. 6 is a top view showing a generated heat distribution in a saturation region of the heretofore known MOSFET.
Figure 7:
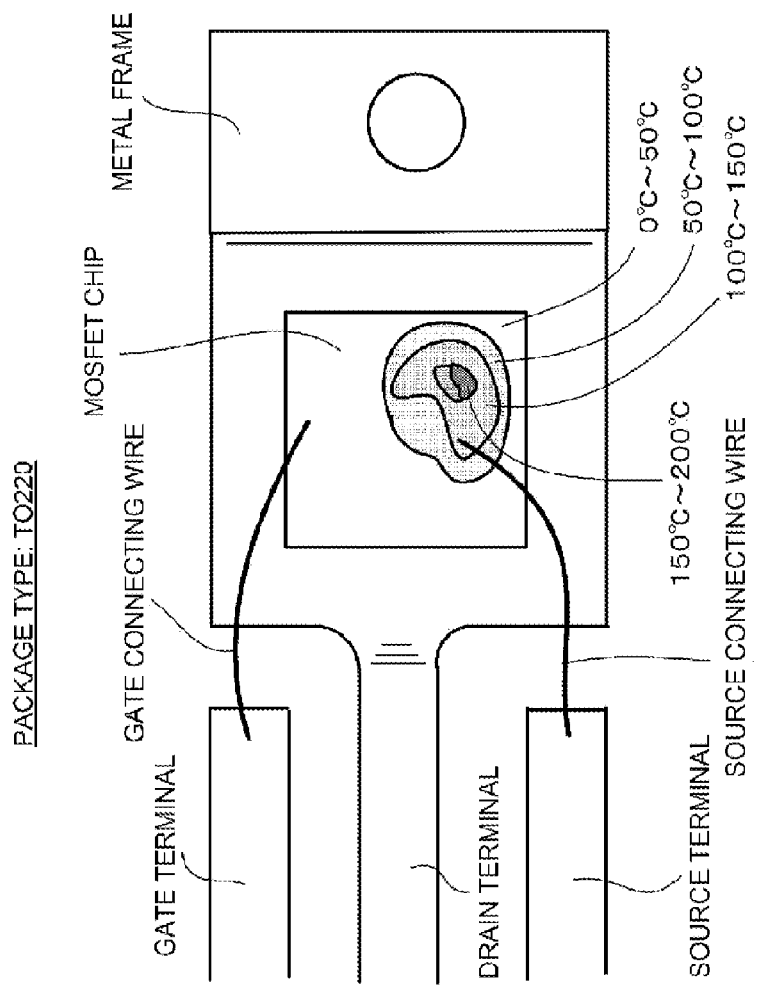
FIG. 7 is a top view showing a generated heat distribution in a saturation region of the heretofore known MOSFET.
Figure 8:
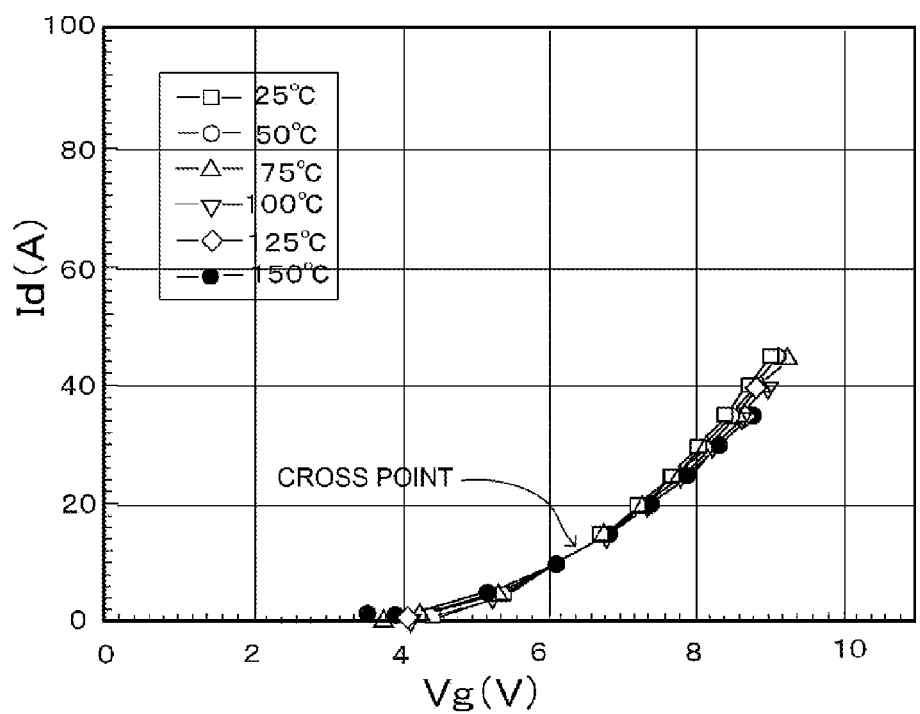
FIG. 8 is a characteristic diagram showing the temperature dependence of Vg-Id characteristics of the heretofore known MOSFET.
Figure 9:
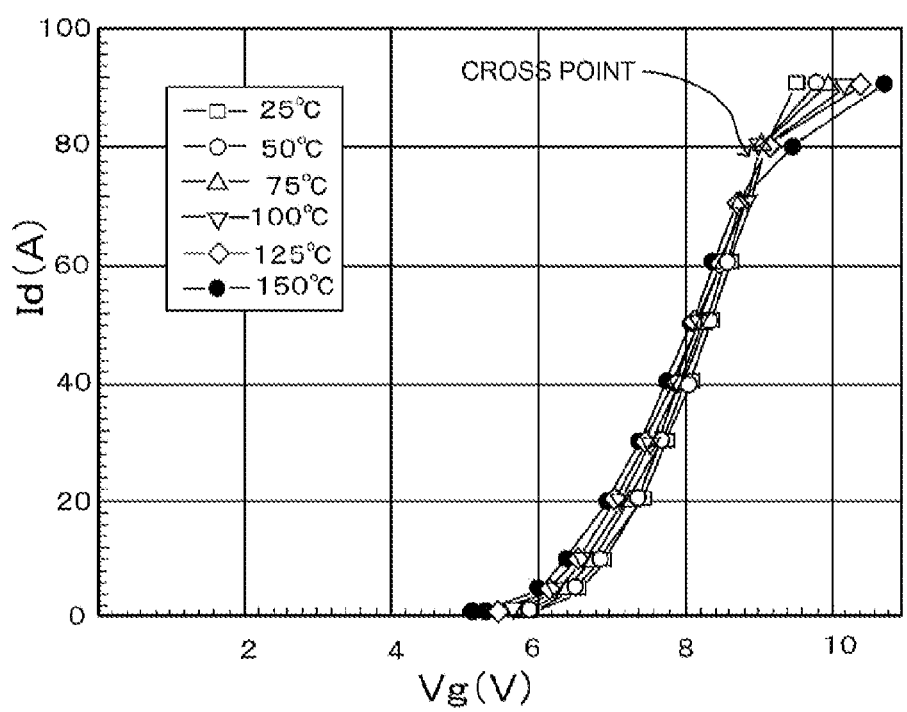
FIG. 9 is a characteristic diagram showing the temperature dependence of Vg-Id characteristics of the heretofore known MOSFET.

Hereafter, a detailed description will be given, referring to the drawings, of an embodiment according to an MOS semiconductor device of the invention. In the present specification and the accompanying drawings, n and p mean that electrons or holes are majority carriers in layers or regions prefixed with n or p. Also, +or − superscribed after n and p respectively means relatively high or low in impurity concentration. In the following description of the embodiment and the accompanying drawings, the same reference signs will be given to the same configurations, and a redundant description will be omitted. Also, the accompanying drawings described in the embodiment are not depicted on an exact scale or at an exact dimensional ratio for ease of visualization and comprehension. The invention is not limited to the description of the embodiment, to be described hereafter, without departing from the scope of the invention.

Embodiment 1

FIG. 1 is a main portion sectional view showing a ½ cell structure of a planar vertical power MOSFET according to the invention. A description will be given hereafter of a structure of the planar vertical power MOSFET. The rated voltage of the planar vertical power MOSFET of Embodiment 1 is 30V to 600V (250V in Embodiment 1), and the rated current thereof is 1A to 100A (42A in Embodiment 1). An n-type low resistance region 1 which is also a drain region is set to, for example, $7 \times 10^{17}$ atoms/cm$^3$ to $6 \times 10^{19}$ atoms/cm$^3$ in impurity concentration. The n-type low resistance region 1 (drain region) has thereon an n-type drift layer 2 (for example, $7.8 \times 10^{16}$ atoms/cm$^3$ to $8.5 \times 10^{13}$ atoms/cm$^3$ in impurity concentration and 3 μm to 50 μm in thickness) deposited by an epitaxial growth method, or the like, and provided with a voltage support function. In Embodiment 1, the n-type drift layer 2 is, for example, $8.8 \times 10^{14}$ atoms/cm$^3$ in impurity concentration and 25 μm in thickness. The n-drift layer 2 has on the surface layer thereof a p-type body region 3a (for example, $1 \times 10^{16}$ atoms/cm$^3$ to $5 \times 10^{18}$ atoms/cm$^3$ in impurity concentration and 1 μm to 10 μm in thickness) selectively formed into a well by an ion implantation. In Embodiment 1, the p-type body region 3a is, for example, $8 \times 10^{16}$ atoms/cm$^3$ in impurity concentration and 3.5 μm in thickness. An n-type source region 4 formed on a surface layer in the p-type body region 3a is set to, for example, $1 \times 10^{19}$ atoms/cm$^3$ to $1 \times 10^{22}$ atoms/cm$^3$ in impurity concentration and 0.1 μm to 2.0 μm in thickness. In Embodiment 1, the n-type source region 4 is, for example, $1 \times 10^{22}$ atoms/cm$^3$ in impurity concentration and 0.3 μm in thickness. Furthermore, a channel formation region 5a extending along the surface of the p-type body region 3a is provided in a portion, exposed to the surface of a semiconductor substrate, which is sandwiched between the surface layer of the n-type drift layer 2 and the surface layer of the n-type source region 4. Also, a gate electrode 6 formed from polysilicon deposited via a gate insulating film 9 (for example, 100 Å to 1200 Å in thickness) is provided on the surface of the channel formation region 5a. In Embodiment 1, the thickness of the gate insulating film 9 is, for example, 1000 Å. Also, Vth is adjusted to 0.5V to 6.0V by the above structure, and in Embodiment 1, Vth is, for example, 3.5V. A drain electrode 8 is provided on the rear surface side of the n-type low resistance region 1, and a source electrode 7 is provided on the surface of the n-type source region. The n-type drift layer 2 is equal in potential to the n-type low resistance region 1, and is also the drain region.

This planar MOSFET 200a is such that an n channel is formed in the channel formation region 5a when a gate voltage equal to or higher than the gate threshold voltage with is applied between the gate electrode 6 and source electrode 7. By so doing, a channel of n-type electrons is formed connecting the n-type source region 4 and the n-type drift layer 2 and drain region 1.

Figure 14:
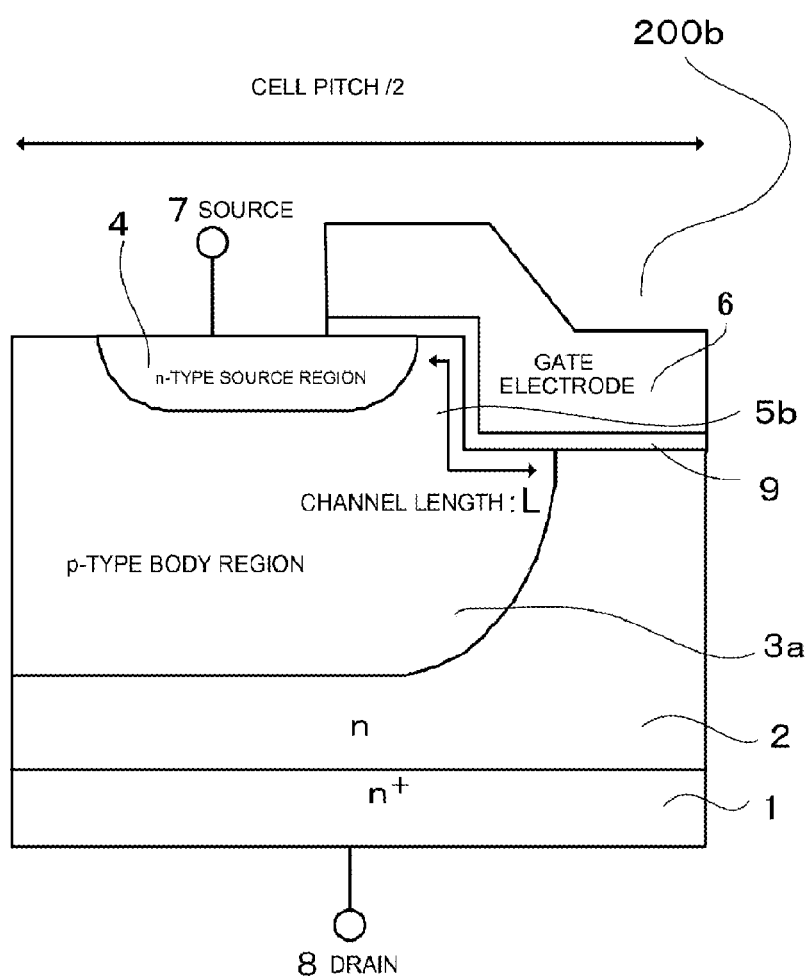
FIG. 14 is a main portion sectional view of a planar MOSFET according to the invention.

A characteristic structure of the planar MOSFET 200a of the invention shown in FIG. 1 is such that the surface of the channel formation region 5a is not flat, and a surface thereof on the n-type drift layer 2 side has a higher level than a surface thereof on the n-type source region 4 side. By providing this kind of level difference on the surface of the channel formation region 5a, it is possible to increase a channel length (L) without increasing a cell pitch. Herein, the channel length is a distance in a direction in which current flows through the channel formation region. Also, an overall length of the channel formation region in a direction perpendicular to the direction of the channel length is referred to as a channel peripheral length. FIG. 14 shows a planer MOSFET 200b different in that a surface of a channel formation region 5b on the n-type drift layer 2 side has a lower level than a surface thereof on the n-type source region 4 side, as opposed to FIG. 1. It is preferable that the height of the level difference of the channel formation region 5b, as well as that of the channel formation region 5a, is set to on the order to 0.1 μm to 10.0 μm. The reason for setting the lower limit of the height of the level difference to 0.1 μm is that it is when Gd to be described hereafter is reduced by 10% or more that an SOA improvement effect can be ascertained to be a significant difference. The minimum value of the channel length of a general MOS being on the order of 1.0 μm, it is sufficient to increase the channel length by 10% in order to reduce Gd by 10%, and the minimum value of the level difference for this purpose is 0.1 μm. Similarly, the reason for setting the upper limit to 10.0 μm is that all the level difference portion needs to be covered with the p-type body region, and the maximum thickness of the p-type body region of a general MOS is the upper limit of the level difference. The upper limit is, more preferably, 0.1 μm or more and 3.0 μm or less.

Owing to the principle to be described hereafter, it is possible to suppress a deterioration of a high voltage side SOA without widening the cell pitch by forming the level difference so that the channel length (L) increases. A simple (linear) increase in the channel length (L) without providing any level difference, as in a heretofore known channel formation region, leads to an increase in the cell pitch, so that the cell density decreases, a current channel decreases (in channel width or channel peripheral length (Z)), and on-resistance (Ron) increases.

A description will be given hereafter of the reason that it is possible to expand the SOA while suppressing an increase in the on-resistance, according to the MOSFET of the invention including the configuration of increasing the channel length (L) without widening the cell pitch, as heretofore described.

With regard to Vg-Id characteristics showing that the SOA of the high voltage region of the MOSFET decreases, it is conceivable that how a current (Id) increases (the gradient of the drain-source current Id) when a gate voltage (Vg) is increased is equivalent to the channel conductance (Gd). That is, the channel conductance (Gd) is represented by the following expression (1).

$$Gd = (Z/L)\mu_n Co(Vg-Vth) \quad (1)$$

Z: Channel peripheral length, L: Channel length, $\mu_n$: Electron mobility, Co: Gate capacitance, Vg: Gate voltage, and Vth: Gate threshold voltage As Vth decreases as opposed to a rise in temperature, Vg-Vth increases. $\mu_n$ decreases as opposed to the rise in temperature, but the decrease in Vth is greater than the decrease in $\mu_n$, meaning that the expression (1) exhibits a negative characteristic with respect to the temperature. Because of this, the channel conductance (Gd) increases as the temperature rises, and the current (Id) increases.

As opposed to this, the channel conductance (Gd) decreases by increasing the channel length (L) of the denominator. By so doing, it is possible to lessen the increase in Gd due to the decrease in Vth.

According to the above, increasing the channel length (L) leads to widening the "negative" temperature coefficient region of the Vg-Id characteristics (that is, to lowering the temperature characteristic cross point of the Vg-Id characteristics to the lower current (Id) side), and it is possible to expand the SOA.

Figure 10:
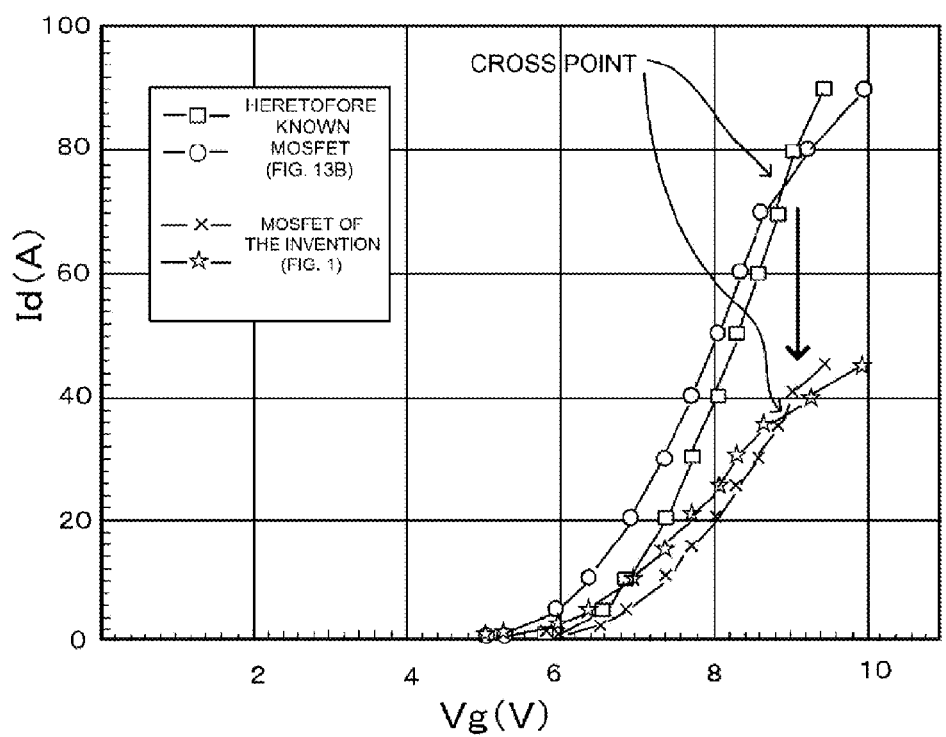
FIG. 10 is a characteristic diagram showing the temperature dependences of the respective Vg-Id characteristics of the MOSFET according to the invention and the heretofore known MOSFET.
Figure 11:
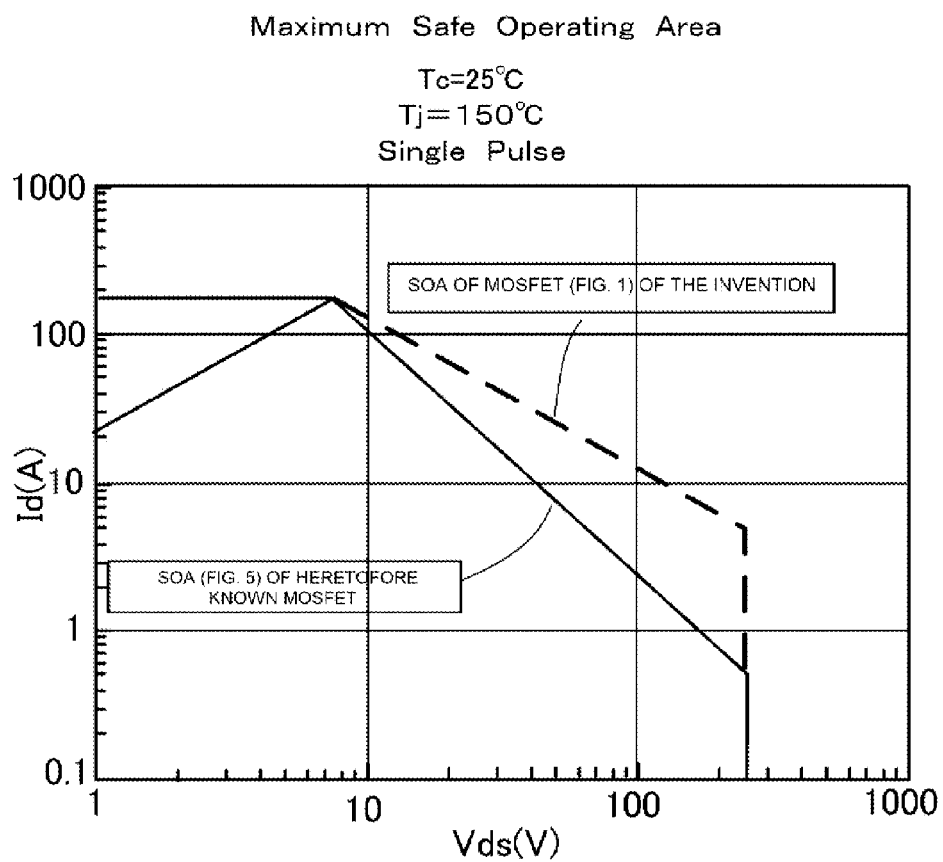
FIG. 11 is an SOA comparison diagram of the MOSFET according to the invention and the heretofore known MOSFET.
Figure 12:
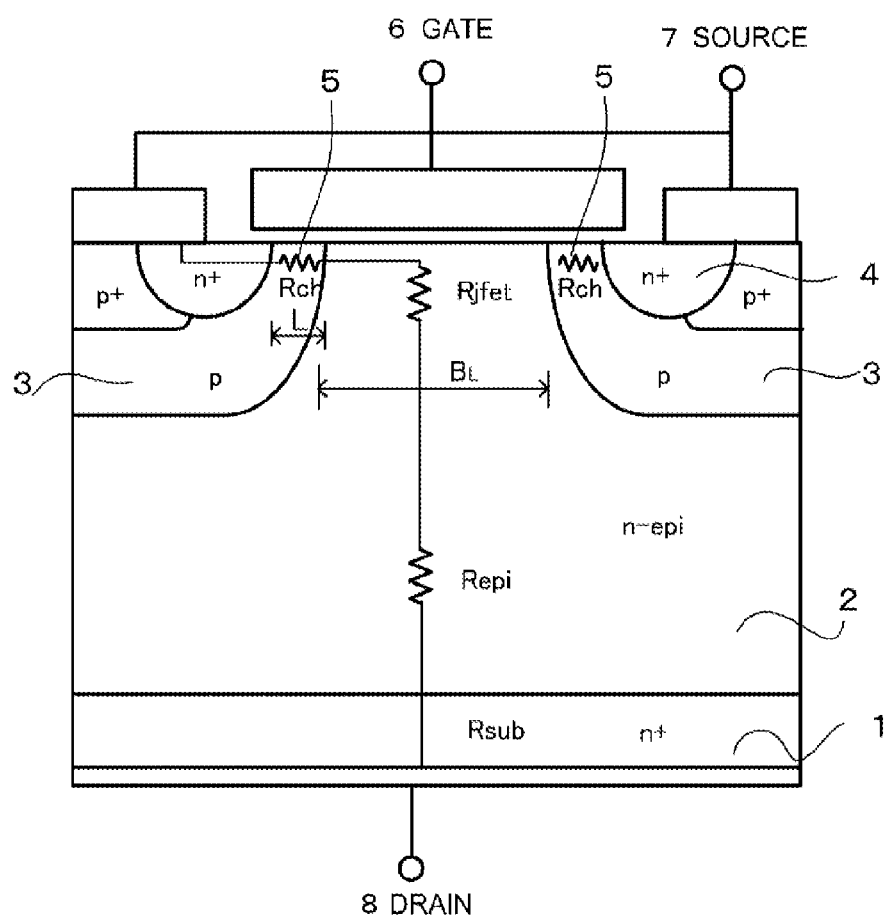
FIG. 12 is a main portion sectional view showing three main resistance components of the on-resistance of an MOSFET.
Figure 13A:
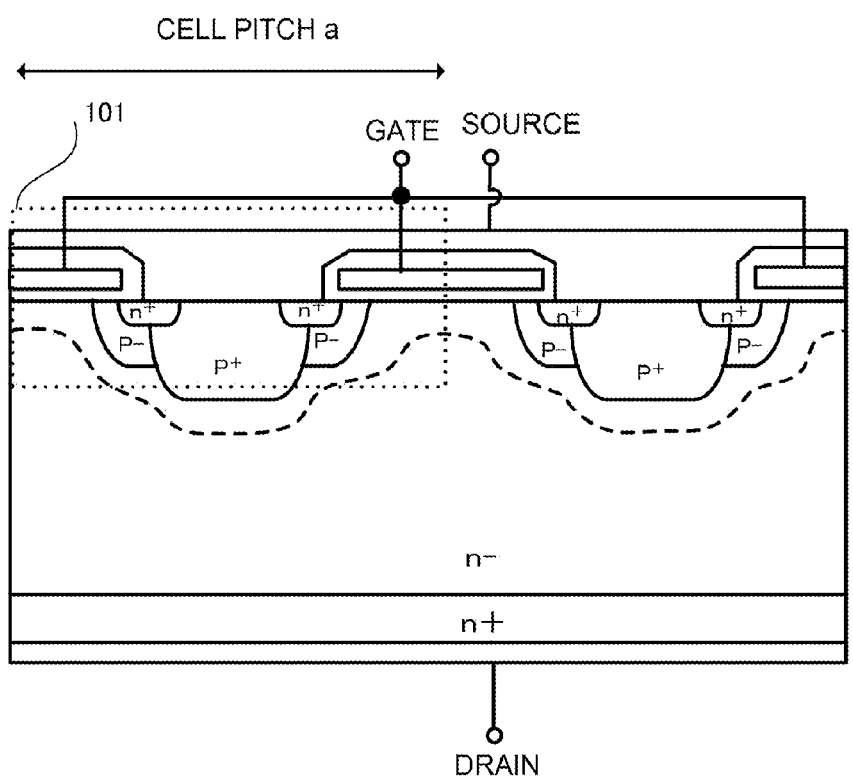
FIGS. 13A and 13B are main portion sectional views of the heretofore known MOSFETs different in cell pitch.
Figure 13B:
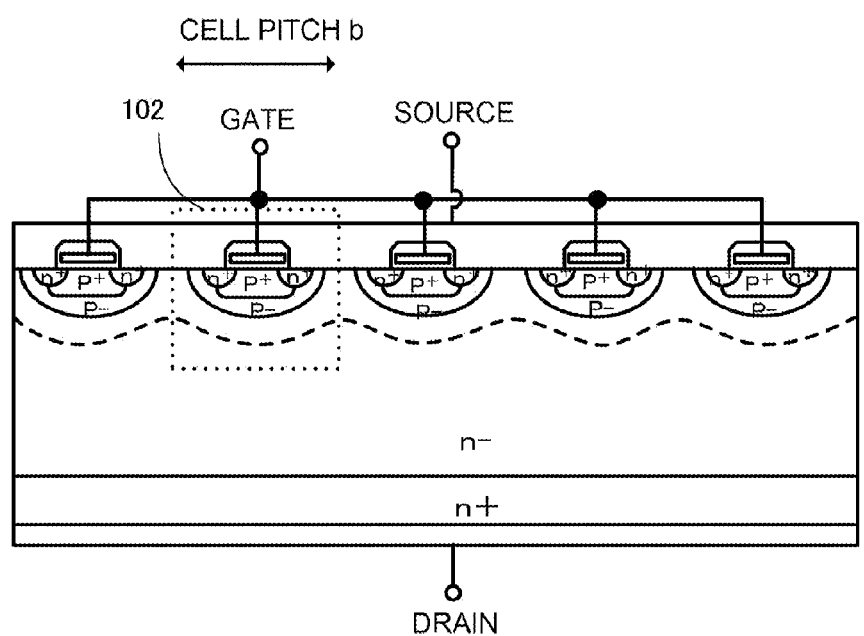

The Vg-Id characteristics of the MOSFET of the invention (FIG. 1) and those of a heretofore known MOSFET (FIG. 13B) are compared and shown in FIG. 10 by the X marks and the ☆ marks for the MOSFET of the invention and by the □ marks and the ○ marks for the heretofore known MOSFET. With the MOSFET of the invention (FIG. 1), as the channel length (L) is increased, it is possible to lower the temperature characteristic positive/negative cross point of the Vg-Id characteristics to the low current (Id) side, as shown by the arrow in FIG. 10. As a result of this, it can be seen that it is possible to expand the SOA (broken line) of the MOSFET of the invention as compared with the heretofore known, as in a Vds-Id characteristic diagram wherein the SOA of the MOSFET of the invention (FIG. 1) and the SOA of the heretofore known MOSFET (FIG. 13B) are compared and respectively shown by the broken line and solid line in FIG. 11. It is also shown in FIG. 11 that the previously described SOA expansion effect is particularly remarkable on the high voltage side of the drain-source voltage (Vds). It is possible to obtain, ideally, an SOA with constant power determined by a device size and frame thermal resistance.

Also, as the plane direction of the Si semiconductor substrate varies in the level difference portion formed on the channel formation region surface according to the invention, it is also possible to yield the advantageous effect of keeping the channel conductance (Gd) low by the mobility μ decreasing.

According to the heretofore described MOSFET of the embodiment of the invention, it is possible to expand the SOA of the high voltage region with low on-resistance characteristics being maintained. However, as channel resistance Rch increases slightly, the MOSFET according to the embodiment, having a greater effect than in the case of a device which is a high voltage (500V or more) product, is effective. Also, the MOSFET according to the embodiment is suitable for application to a linear regulator using the high voltage region.

What is claimed is:

1. A MOS semiconductor device including a MOS gate structure, the MOS semiconductor device comprising:
   a first conductivity type drain region;
   a drift region of the first conductivity type that is formed on the drain region;
   a second conductivity type well region selectively disposed on a surface of the first conductivity type drift region;
   a source region of the first conductivity type selectively disposed on a surface of the second conductivity type well region;
   an insulating film extending along partially on an upper surface of the source region, a portion of the surface of the well region and a principal surface of the drift region;
   a conformal gate electrode disposed on an upper surface of the insulating film;
   a channel formation region sandwiched between the source region and the portion of the surface of the well region; and
   wherein a surface of the channel formation region has a level difference formed in a direction of a peripheral length, and across a length, of the channel formation region, the level difference including a low portion that is parallel to the principal surface of the first conductivity type drift region and is low in a direction orthogonal to the principal surface of the first conductivity type drift region, a high portion that is parallel to the principal surface of the first conductivity type drift region and is higher than the low portion in the direction orthogonal to the principal surface of the first conductivity type drift region, and an intermediate portion connecting the low portion and the high portion,
   wherein a height of the level difference is set between 0.1 μm and 10 μm.

2. The MOS semiconductor device according to claim 1, wherein the first conductivity type source region is located adjacent to the low portion of the level difference of the channel formation region.

3. The MOS semiconductor device according to claim 1, wherein the MOS semiconductor device is a MOSFET.

* * * * *